(12) United States Patent  
Lutz, Jr.

(10) Patent No.: US 6,582,241 B1
(45) Date of Patent: Jun. 24, 2003

(54) INSERTION/EXTRACTION APPARATUS FOR CIRCUIT CARDS

(75) Inventor: Ronald D. Lutz, Jr., Round Rock, TX (US)

(73) Assignee: General Bandwidth Inc., Austin, TX (US)

( * ) Notice: Subject to any disclaimer, the term of this patent is extended or adjusted under 35 U.S.C. 154(b) by 101 days.

(21) Appl. No.: 09/768,849

(22) Filed: Jan. 23, 2001

(51) Int. Cl.[7] .............................................. H01R 13/62
(52) U.S. Cl. ...................................... 439/157; 439/160
(58) Field of Search ................................ 439/157, 160, 439/304, 306, 326, 328, 376, 153, 377

(56) References Cited

U.S. PATENT DOCUMENTS

| | | | | |
|---|---|---|---|---|
| 3,944,311 A | | 3/1976 | Sprenkle et al. .............. 339/45 |
| 4,606,591 A | * | 8/1986 | Bloch .......................... 439/157 |
| 4,875,867 A | * | 10/1989 | Hoo ............................ 439/157 |
| 5,139,430 A | | 8/1992 | Lewis et al. ................. 439/157 |
| 5,381,314 A | * | 1/1995 | Rudy, Jr. et al. ............ 361/712 |
| 5,672,069 A | | 9/1997 | Cheng et al. ................ 439/160 |
| 5,676,555 A | | 10/1997 | Yu et al. ...................... 439/157 |
| 5,730,611 A | | 3/1998 | Cheng et al. ................ 439/160 |
| 5,746,613 A | | 5/1998 | Cheng et al. ................ 439/157 |
| 5,862,774 A | * | 1/1999 | Moss .......................... 116/200 |
| 5,957,708 A | | 9/1999 | Lin et al. ..................... 439/157 |
| 5,980,282 A | | 11/1999 | Cheng ......................... 439/157 |
| 5,989,043 A | | 11/1999 | Han et al. .................... 439/157 |
| 5,993,235 A | | 11/1999 | Chen ........................... 439/326 |
| 6,027,351 A | | 2/2000 | Hashimoto ................... 439/160 |
| 6,036,511 A | | 3/2000 | Hashimoto ................... 439/159 |

* cited by examiner

Primary Examiner—Brian Sircus
Assistant Examiner—Chandrika Prasad
(74) Attorney, Agent, or Firm—Baker Botts L.L.P.

(57) ABSTRACT

According to one embodiment of the invention, an insertion/extraction apparatus for circuit cards includes a card cage having at least one card guide and at least one channel, at least one circuit card engaged with the card guide, and at least one ejector pivotally coupled to the circuit card. The ejector has protrusions proximate a first end that are operable to engage the channel and a fastener disposed through an aperture in the ejector.

34 Claims, 3 Drawing Sheets

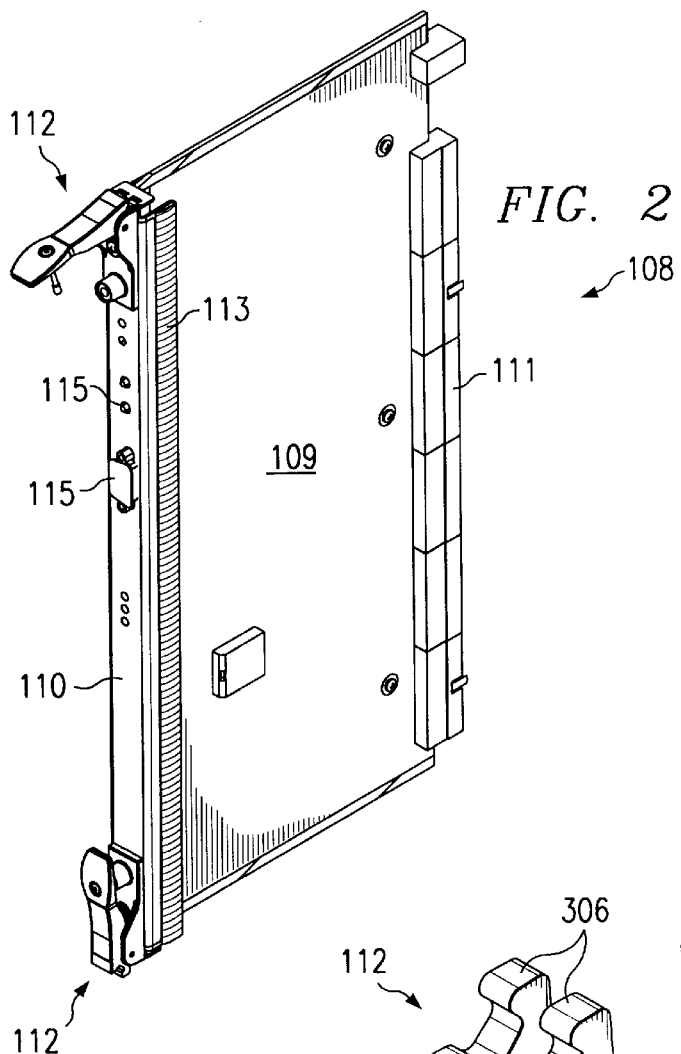
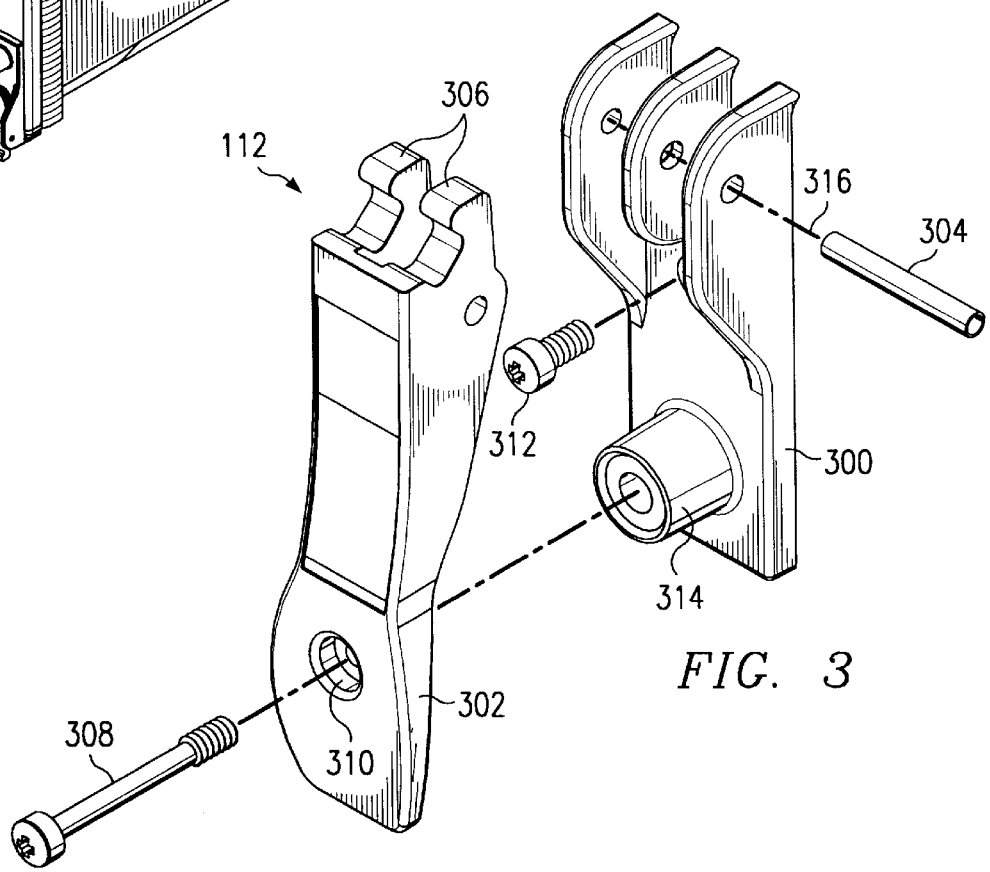

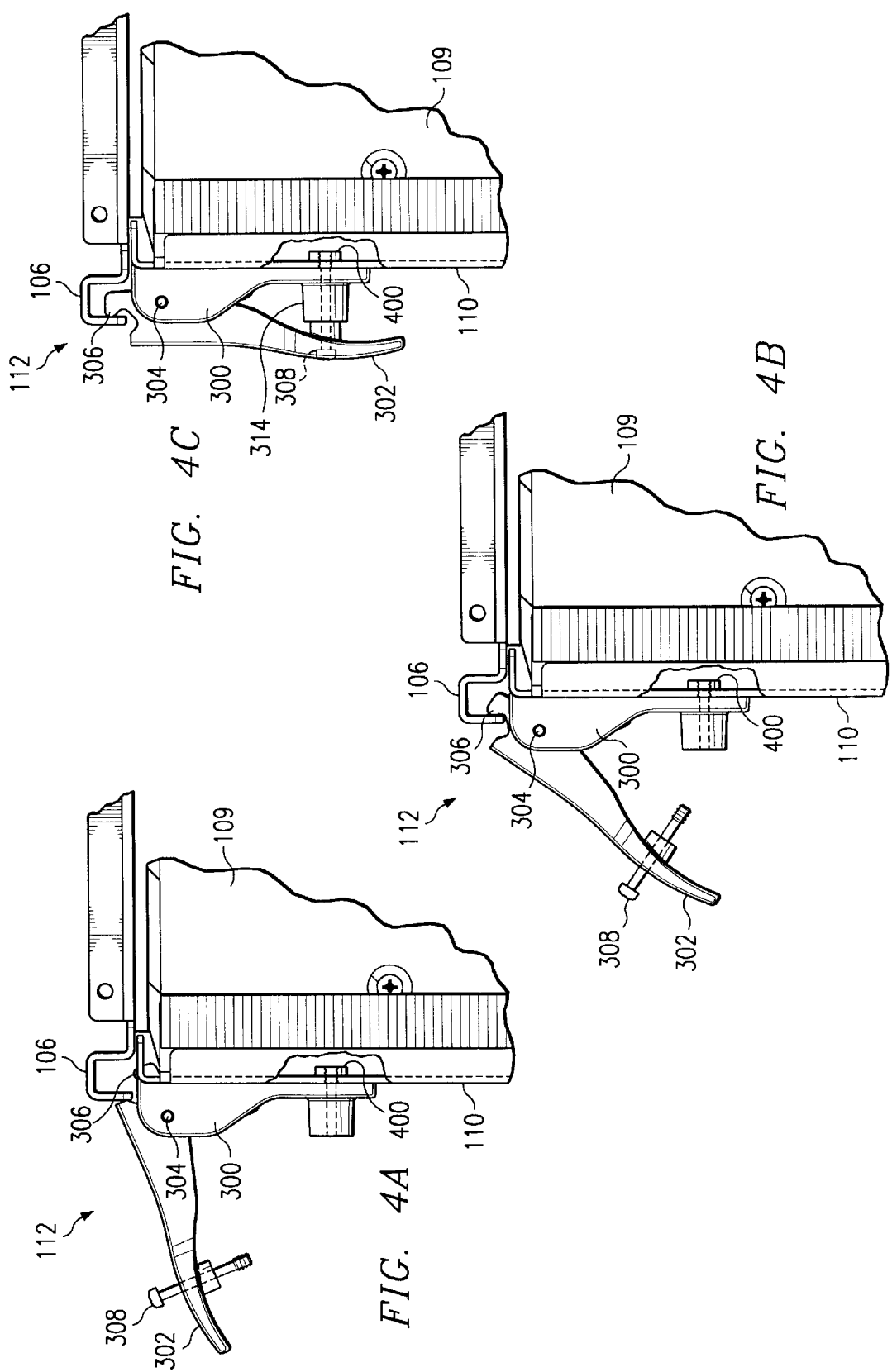

INSERTION/EXTRACTION APPARATUS FOR CIRCUIT CARDS

TECHNICAL FIELD OF THE INVENTION

This invention relates generally to the field of telecommunications and, more specifically, to an insertion/extraction apparatus for circuit cards.

BACKGROUND OF THE INVENTION

Central offices house numerous telecommunication devices, such as voice gateways, DSLAMs, channel banks, and Class 5 switches. These telecommunication devices typically have multiple circuit cards disposed within a card cage. The circuit cards generally include printed circuit assemblies attached to faceplates. These circuit cards are sometimes referred to as field replaceable units ("FRUs"). For various reasons, FRUs sometimes have to be replaced in the field. Therefore, FRUs utilize insertion/extraction devices (sometimes referred to as ejectors) to make it easier for field personnel to insert and extract them from the card cage.

Telecommunications equipment manufacturers take into account many criteria when designing and manufacturing ejectors for use on FRUs, including ease of replacement, low cost of manufacturing, and low emissions. In addition, certain standards affect design. One such standard is a Network Equipment Building Standard ("NEBS") TR-78 standard by Bellcore, which states that FRUs have to be replaceable without tools. Another standard is a safety standard, UL1950, that requires FRUs to be secured down in place. The reason for this standard is to prevent users from touching any hazardous voltage on the backplane of telecommunication devices. Ironically, these two standards somewhat conflict, which makes it difficult for a telecommunications equipment manufacturer to meet both of them when designing and manufacturing ejectors. Therefore, some types of ejectors meet either the NEBS standard or the UL1950 standard, but not both.

Various types of ejectors exist, and one such type adds a captive fastener to the faceplate of the FRU that mates to a portion of the card cage via tapped holes. This results in a much higher cost associated with manufacturing the card cage because of drilling and tapping holes in the card cage. This also means that severe alignment/tolerance problems exist when trying to match up the screws in the faceplate to the holes on the FRU. Some ejectors connect directly to the printed circuit assemblies, which means that large notches or holes exist in the faceplate thereby letting emissions escape from inside the card cages.

SUMMARY OF THE INVENTION

The challenges in the field of telecommunications continue to increase with demands for more and better techniques having greater flexibility and adaptability. Therefore, a need has arisen for a new insertion/extraction apparatus for circuit cards.

In accordance with the present invention, an insertion/extraction apparatus for circuit cards is provided that addresses disadvantages and problems associated with previously developed insertion/extraction apparatuses.

According to one embodiment of the invention, an insertion/extraction apparatus for circuit cards includes a card cage having at least one card guide and at least one channel, at least one circuit card engaged with the card guide, and at least one ejector pivotally coupled to the circuit card. The ejector has protrusions proximate a first end that are operable to engage the channel and a fastener disposed through an aperture in the ejector.

Some embodiments of the invention provide numerous technical advantages. For example, a technical advantage of one embodiment of the present invention is that an ejector locks to either itself or a faceplate of a field replaceable unit, which results in a much lower cost of manufacture by avoiding drilling and tapping holes in a card cage or having to use static or floating fastening devices attached to the card cage. Furthermore, alignment and tolerance problems are eliminated, which significantly saves manufacturing cost. Another technical advantage of one embodiment of the present invention is that an ejector manufactured according to the teachings of the present invention meets both the UL1950 safety requirement and the NEBS TR-78 standard. An additional advantage of one embodiment of the present invention is lower emissions emanating from inside telecommunications apparatuses by utilizing ejectors manufactured according to the teachings of the present invention.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which:

FIG. 2 is an isometric view of a circuit card showing one ejector in an open position and an opposing ejector in a closed position according to one embodiment of the present invention;

FIG. 3 is an exploded view of an ejector according to one embodiment of the present invention; and FIGS. 4A through 4C are partial elevation views illustrating various stages of inserting a circuit card in a central office telecommunications apparatus utilizing an ejector according to one embodiment of the present invention.

DETAILED DESCRIPTION OF EXAMPLE EMBODIMENTS OF THE INVENTION

Figure 1:
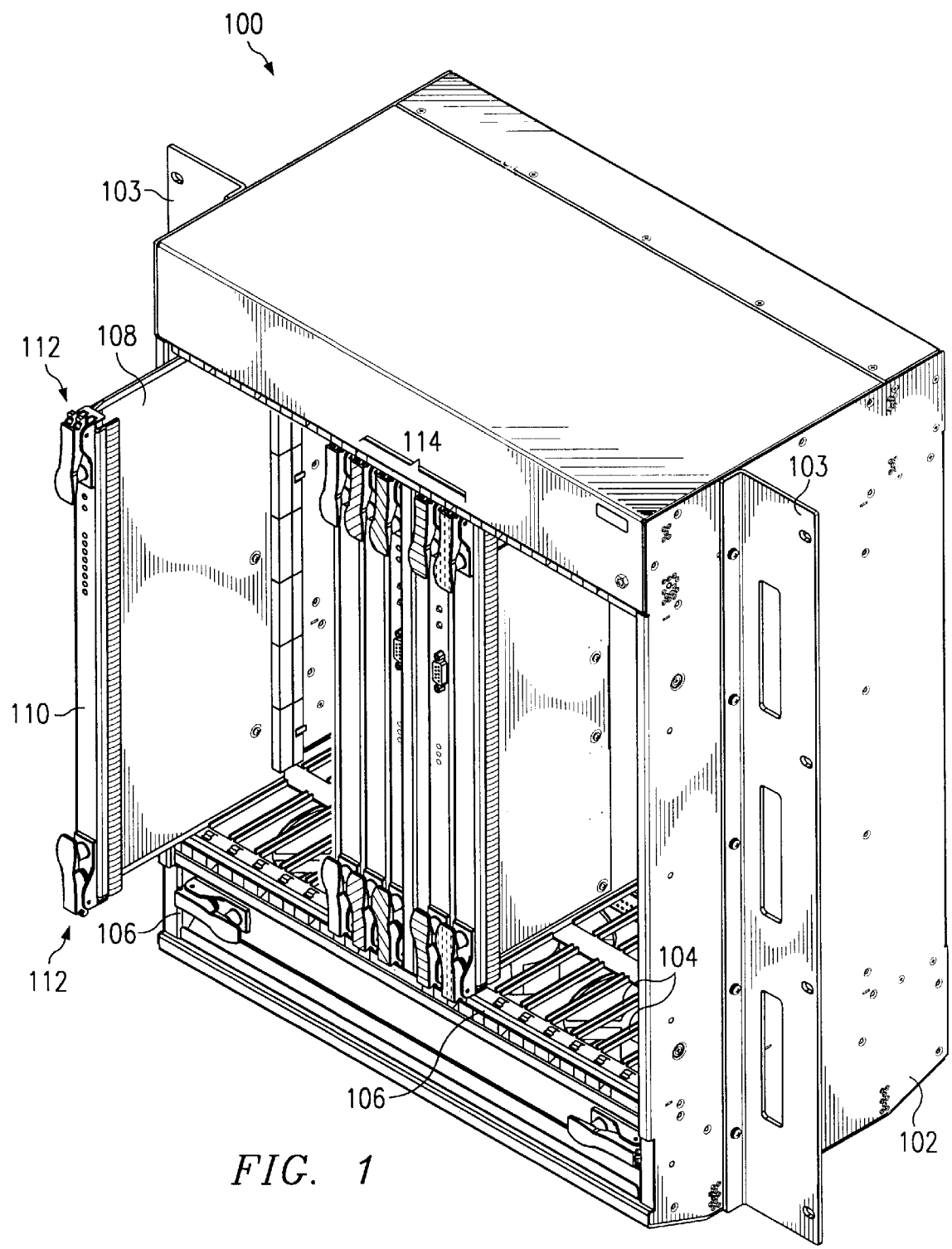
FIG. 1 is an isometric view of a central office telecommunications apparatus having a plurality of circuit cards engaged with a plurality of card guides according to one embodiment of the present invention.

Example embodiments of the present invention and their advantages are best understood by referring now to FIGS. 1 through 4C of the drawings, in which like numerals refer to like parts.

FIG. 1 is an isometric view of a central office telecommunications apparatus 100 having a plurality of circuit cards 108 disposed therein according to one embodiment of the present invention. Circuit cards 108, discussed in greater detail below in conjunction with FIG. 2, receive incoming subscriber communication signals to connect subscribers to a network, such as an ATM network, frame relay network, or other high-speed network. Circuit cards 108 electrically couple to a backplane (not explicitly shown in FIG. 1) that is part of telecommunications apparatus 100. Circuit cards 108 sometimes require replacement. For this reason, circuit cards 108 are also known as, among other names, field replaceable units ("FRUs"). To facilitate replacement, circuit cards 108 typically have insertion/extraction devices, sometimes referred to as ejectors. According to the teachings of the present invention, ejectors 112 are operable to insert circuit cards 108 into, and extract circuit cards 108 from, telecommunications apparatus 100. Ejectors 112 are discussed more fully below in conjunction with FIGS. 2 through 4C.

Telecommunications apparatus 100, in one embodiment, is a G6 Voice Gateway from General Bandwidth Company; however, telecommunications apparatus 100 may be other types of telecommunications devices, such as a DSLAM, a channel bank, a Class 5 switch, or other types of equipment. As illustrated in FIG. 1, telecommunications apparatus 100 includes a card cage 102, a plurality of card guides 104, at least one channel 106, circuit cards 108, and ejectors 112. Card cage 102 is also sometimes called a chassis, and is essentially a frame for mounting circuit cards 108 in a central office environment. Card cage 102 may take any suitable shape or form, but generally has a square or rectangular shape. Card cage 102 may also have, among other things, mounting ears 103 to mount telecommunications apparatus 100 in an equipment rack.

Card guides 104 are trough-like members existing in card cage 102 for the purpose of guiding circuit cards 108 into card cage 102 so that circuit cards 108 align with connectors on a backplane of telecommunications apparatus 100. Card guides 104 are formed on, or coupled to, guide plates (not explicitly shown), and may be formed from any suitable type of material, such as metal or plastic. There may be one or any number of card guides 104 depending on the type of circuit cards 108 utilized and the type of card cage 102 utilized. Card guides 104 generally exist on both a floor (as illustrated in FIG. 1) and a ceiling of card cage 102. In an embodiment where circuit card 108 is horizontal instead of vertical as illustrated in FIG. 1 at the bottom of card cage 102, card guides 104 may exist on either side of card cage 102.

As shown in FIG. 1, channel 106 is shown to extend along the bottom, and near the front, of card cage 102. Another channel 106 extends along the top, and near the front, of card cage 102 and is not shown in FIG. 1 because of the isometric view shown. In an embodiment where circuit card 108 is horizontal instead of vertical, channels 106 may exist on either side of card cage 102. The function of channels 106 is to secure circuit cards 108 inside card cage 102 by having ejectors 112 engage channels 106. In one embodiment, channel 106 is formed in the shape of a "U;" however, channel 106 may be formed to resemble other shapes. Channels 106 are generally the same material as card cage 102; however, other suitable materials may be used.

Also shown in FIG. 1 are ejectors 112 having different shadings (denoted by an arrow 114) for the purpose of distinguishing the functions of circuit cards 108 in card cage 102. The different shadings on ejectors 112 connote different colors of ejectors 112, wherein a particular color indicates a respective circuit card 108 function. As examples, a yellow color may indicate a system controller module, a green color may indicate a network interface card, and a blue color may indicate a T1 card. In some embodiments, a red color is not used because of its well known use as a color for denoting danger. Either a base, a handle, or both a base and a handle of ejector 112 can be color coded. This color coding serves to aid maintenance personnel when replacing circuit cards 108. This substantially reduces or eliminates any errors when replacing circuit cards 108. One or any number of circuit cards 108 may be color coded. In addition to color coding, a sticker or label can be attached to ejectors 112 to further distinguish circuit cards 108 from one another. For example, a sticker can be coupled to ejector 112 that states, "General Bandwidth System Controller # XXX."

Ejectors 112 are described in greater detail below in conjunction with FIGS. 2 through 4C. According to the teachings of the present invention, ejectors 112 allow meeting of somewhat conflicting standards because a user is given the option of either securing circuit cards 108 inside card cage 102 or leaving circuit cards 108 unsecured so that circuit cards 108 are replaceable without tools. Ejectors 112 can also be connected to devices that are outside the telecommunications field.

FIG. 2 is an isometric view of circuit card 108 showing one ejector 112 in an "open" position and an opposing ejector 112 in a "closed" position according to one embodiment of the present invention. Circuit cards 108, in one embodiment, are telephony cards; however, circuit cards 108 may be other types of circuit cards, such as T1 cards, network cards, and system controller modules. Circuit cards 108 typically comprises a printed circuit assembly 109, a face plate 110, and a circuit card connector 111. Circuit card 108 may also include, among other things, a flexible member 113.

Printed circuit assembly 109 is essentially a printed circuit board with electronic componentry (not shown), such as integrated circuits, power supplies, resistors, capacitors, and conductive traces, which connect and route subscriber signals to a network. Face plate 110 is the front of circuit card 108 and, in one embodiment, has connectors 115 that accept subscriber lines, such as fiber optic cables. Communication signals from subscriber lines route through printed circuit assembly 109 so that the communication signals can be connected to a backplane of telecommunications apparatus 100 for aggregation purposes. The communication signals may connect to the backplane via circuit card connectors 111.

Circuit card connectors 111 are any suitable type of communication connectors that are operable to connect to a backplane of telecommunications apparatus 100. There may be one or any number of circuit card connectors 111. Card guides 104, as described above, may be used to properly align circuit card connectors 111 when inserting circuit card 108 into card cage 102 so that circuit card connectors 111 correctly mate to connectors on the backplane of telecommunications apparatus 100.

Flexible member 113 may be incorporated in circuit cards 108 and, if used, couples to faceplate 110 in any suitable manner and extends along substantially the full height of circuit card 108. In one embodiment, flexible member 113 is formed from a series of thin horizontal metal members stacked upon one another; however, flexible member 113 may take other suitable forms and shapes. The function of flexible member 113 is to aid in forming a "Faraday cage" around the inside electronic componentry of telecommunications apparatus 100 to keep any electromagnetic interference inside telecommunications apparatus 100. Flexible member 113 accomplishes this by abutting an adjacent circuit card 108 in card cage 102. In other words, as shown in FIG. 1, a plurality of circuit cards 108 are stacked adjacent one another and flexible member 113 acts like a spring and presses against the adjacent circuit card 108 to ensure there are no gaps between adjacent circuit cards 108.

FIG. 2 also shows an "open" ejector 112 near the top of circuit card 108 and a "closed" ejector 112 near the bottom. As discussed below in conjunction with FIGS. 4A–4C, the open position illustrates ejector 112 before circuit card 108 is inserted into card cage 102 and the closed position illustrates ejector 112 after circuit card 108 is inserted into card cage 102.

FIG. 3 is an exploded view of ejector 112 according to one embodiment of the present invention. In the embodiment shown in FIG. 3, ejector 112 includes a base 300 and a handle 302 pivotally coupled to base 300 with a hinge pin 304. Ejector 112 also includes protrusions 306 proximate a first end of handle 302 and a fastener 308 disposed through a hole 310 in handle 302 in this embodiment.

In one embodiment, base 300 couples to faceplate 110 (not explicitly shown in FIG. 3) using a fastener 312; however, base 300 may be coupled to faceplate 110 using any suitable method of attachment. In one embodiment, base 300 has a base projection 314 for accepting fastener 308; however, base 300 may have an opening instead of base projection 314 in an embodiment where fastener 308 attaches directly to faceplate 110 of telecommunications apparatus 100. This is best shown in FIG. 4C and is discussed more fully below. In an alternative embodiment of the present invention, base 300 does not exist. This embodiment is where ejector 112 pivotally couples directly to circuit card 108. In this embodiment, fastener 308 attaches directly to faceplate 110.

Handle 302 pivotally couples to base 300 or circuit card 108 with hinge pin 304; however, handle 302 may pivotally couple to either base 300 or circuit card 108 in other suitable manners. Handle 302 may be formed from any suitable material, such as metal or plastic, and may be any size and shape suitable for personnel to grip handle 302 for the purpose of inserting and extracting circuit card 108 from telecommunications apparatus 100. In the embodiment shown in FIG. 3, a pivot axis 316 for handle 302 exists outside of faceplate 110. However, in an embodiment where ejector 112 couples directly to circuit card 108, pivot axis 316 may exist inside faceplate 110.

In one embodiment, hinge pin 304 is press fit into holes formed in both base 300 and handle 302; however, hinge pin 304 may pivotally couple handle 302 to base 300 in any suitable manner. Hinge pin 304 may be any suitable material, shape or size depending on the sizes of base 300 and handle 302.

Protrusions 306 exist proximate one end of ejector 112 in one embodiment. Protrusions 306 are operable to engage at least one channel 106 and to position circuit card 108 relative to telecommunications apparatus 100, such as securing or releasing circuit card 108 from a backplane in telecommunications apparatus 100. As described in greater detail below in conjunction with FIGS. 4A–4C, protrusions 306 engage channel 106 and exert enough force to either insert or extract circuit cards 108. In one embodiment, protrusions 306 are integral with handle 302 and are formed with a shape as shown in FIG. 3; however, protrusions 306 may be coupled to handle 302 in any suitable manner and protrusions 306 may be formed in other suitable shapes. The size and shape of protrusions 306 depend on the size and shape of channel 106 and the force needed to either insert or extract circuit cards 108. Protrusions 306 are formed from any suitable material and will generally be formed from the same material as ejector 112 or handle 302, depending on the embodiment.

In one embodiment, fastener 308 is a screw; however, fastener 308 may be other suitable types of fasteners. Fastener 308 may or may not be captive. A captive fastener is a screw-type fastener that does not fall out after it has been unscrewed. A function of fastener 308 is to lock ejector 112 in a closed position. As described in greater detail below in conjunction with FIGS. 4A–4C, this can be accomplished by coupling fastener 308 to base projection 314 on base 300 or coupling fastener 308 to faceplate 110 by disposing it through an opening in base 300. In another embodiment, fastener 308 stays unattached when ejector 112 is in a closed position. Having fasteners 308 disposed in hole 310 of handle 302 facilitates meeting two somewhat conflicting standards for telecommunications equipment. One such standard is a NEBS TR-78 standard by Bellcore, which states that circuits cards 108 have to be replaceable without tools. Another standard is a safety standard, UL1950, that requires circuit cards to be secured in place to prevent human beings from touching any hazardous voltage on a backplane of telecommunications device 100. Since these two standards somewhat conflict, it is difficult for telecommunications equipment manufacturers to meet both of them when designing and manufacturing ejectors. Ejector 112 of the present invention provides a technical advantage in that it can meet either the NEBS standard or the UL1950 standard.

Hole 310 in handle 302 may be any suitable size or shape depending on the size of handle 302 and/or the size of fastener 308.

FIGS. 4A–4C are partial elevation views illustrating various stages of inserting circuit card 108 in telecommunications apparatus 100 utilizing ejector 112 according to one embodiment of the present invention.

FIG. 4A shows circuit card 108 partially inserted into card cage 102. Therefore, ejector 112 is shown in an open position. This position is illustrative of a situation in which a human being (typically a maintenance person) grips handle 302 (person's hand is not shown) and slides circuit card 108 along card guides 104 to connect circuit cards 108 to connectors on a backplane of telecommunications apparatus 100. As illustrated, protrusions 306 have not yet engaged channel 106.

As shown in FIG. 4B, protrusions 306 of ejector 112 start to engage channel 106 as handle 302 is rotated. Protrusions 306 start to exert a force on channel 106 to connect circuit card connector 111 with backplane connectors of telecommunications apparatus 100.

FIG. 4C shows circuit card 108 secured within card cage 102 and ejector 112 in a closed position. Also shown in FIG. 4C is an embodiment where fastener 308 is disposed through base 300 and secured to faceplate 110 of circuit card 108. In one embodiment, threads of fastener 308 screw into a nut 400 that is coupled to the backside of faceplate 110. However, in other embodiments, fastener 308 may screw into base projection 314 or fastener 308 may be left unattached. Having fasteners disposed within hole 310 of handle 302 and attaching and locking ejector 112 in a closed position by attaching to either base 300 or faceplate 110 avoids having to drill and tap holes in a portion of card cage 102. This avoidance results in a much lower cost associated with manufacturing and avoids any alignment/tolerance problems in trying to match up fasteners in faceplate 110 or ejector 112 to holes on card cage 102. In an embodiment where base 300 exists, base 300 avoids having to have any holes, voids, or notches in faceplate 110, which aids in keeping any electromagnetic interference inside card cage 102.

Although embodiments of the invention and their advantages are described in detail, a person skilled in the art could make various alternations, additions, and omissions without departing from the spirit and scope of the present invention as defined by the appended claims.

What is claimed is:

1. A central office telecommunications apparatus, comprising:
   a card cage having at least one card guide and at least one channel;
   at least one circuit card engaged with the card guide; and
   at least one ejector pivotally coupled to the circuit card, the ejector having protrusions proximate a first end operable to engage the channel, the ejector also having a fastener disposed through an aperture in the ejector such that pivoting of the ejector is substantially prevented when the fastener is coupled to the circuit card.

2. The apparatus of claim 1, wherein the ejector comprises:
   a base coupled to a faceplate of the circuit card; and
   a handle pivotally coupled to the base, wherein the fastener is disposed through an aperture in the handle such that pivoting of the handle is substantially prevented when the fastener is coupled to the faceplate of the circuit card.

3. The apparatus of claim 2, wherein the protrusions are formed in the handle.

4. The apparatus of claim 2, wherein the fastener is captively disposed within the aperture in the handle.

5. The apparatus of claim 2, wherein the fastener is a screw.

6. The apparatus of claim 1, wherein the ejector comprises:
   a base coupled to a faceplate of the circuit card; and
   a handle pivotally coupled to the base, wherein the fastener is disposed through an aperture in the handle such that pivoting of the handle is substantially prevented when the fastener is coupled to the base.

7. The apparatus of claim 5, wherein the screw is operable to fasten to the faceplate of the circuit card by protruding through an opening in the base.

8. The apparatus of claim 1, wherein a pivot axis of the ejector is located outside a faceplate of the circuit card.

9. The apparatus of claim 1, wherein the protrusions are operable to secure the circuit card to a backplane in the central office telecommunications apparatus.

10. The apparatus of claim 1, wherein the protrusions are operable to extract the circuit card from a backplane in the central office telecommunications apparatus.

11. A central office telecommunications apparatus, comprising:
    a card cage having a plurality of card guides and a plurality of channels;
    a plurality of circuit cards engaged with the card guides, each circuit card having a faceplate; and
    a pair of opposing ejectors coupled to each faceplate, wherein each ejector comprises:
      a base coupled to the faceplate;
      a handle pivotally coupled to the base, the handle having protrusions proximate a first end operable to engage one of the channels and to position the circuit card relative to the central office telecommunications apparatus; and
      a fastener disposed through an aperture in the handle, whereby the fastener is operable to fix the ejector in a closed position.

12. The apparatus of claim 11, wherein the screw is captively disposed within the aperture in the handle.

13. The apparatus of claim 11, wherein the fastener is operable to fasten to the base.

14. The apparatus of claim 11, wherein the fastener is operable to fasten to the faceplate by protruding through an opening in the base.

15. The apparatus of claim 11, wherein a pivot axis of the handle is located outside the faceplate.

16. The apparatus of claim 11, wherein the protrusions are operable to secure the circuit card to a backplane in the central office telecommunications apparatus.

17. The apparatus of claim 11, wherein the protrusions are operable to release the circuit card from a backplane in the central office telecommunications apparatus.

18. A method for manufacturing telecommunications equipment, comprising:
    providing a card cage having at least one card guide and at least one channel;
    providing at least one circuit card engaged with the card guide; and
    pivotally coupling at least one ejector to the circuit card, the ejector having protrusions proximate a first end operable to engage the channel, the ejector also having a fastener disposed through an aperture in the ejector such that pivoting of the ejector is substantially prevented when the fastener is coupled to the circuit card.

19. The method of claim 18, wherein pivotally coupling at least one ejector to the circuit card comprises:
    coupling a base to a faceplate of the circuit card;
    pivotally coupling a handle to the base; and
    disposing the fastener through an aperture in the handle such that pivoting of the handle is substantially prevented when the fastener is coupled to the faceplate of the circuit card.

20. The method of claim 19, further comprising forming the protrusions in the handle.

21. The method of claim 19, further comprising captively disposing the fastener within the aperture in the handle.

22. The method of claim 19, wherein disposing the fastener through the aperture in the handle comprises disposing a screw through the aperture in the handle.

23. The method of claim 18, further comprising locating a pivot axis of the ejector outside a faceplate of the circuit card.

24. The method of claim 18, further comprising securing the circuit card to a backplane in a central office telecommunications apparatus.

25. The method of claim 18, further comprising extracting the circuit card from a backplane in a central office telecommunications apparatus.

26. A system for distinguishing a plurality of circuit cards in a card cage, comprising:
    a card cage having first and second circuit cards;
    an ejector coupled to the each of the first and second circuit cards, each ejector comprising a base coupled to a faceplate of a respective circuit card and a handle having protrusions proximate a first end operable to engage a channel of the card cage, the handle also having a fastener disposed through an aperture in the handle such that pivoting of the handle is substantially prevented when the fastener is coupled to the circuit card;
    a first color applied to the ejector on the first circuit card; and
    a second color applied to the ejector on the second circuit card, wherein the first and second colors differ and distinguish the first circuit card function from the second circuit card function.

27. The system of claim 26 wherein the first and second colors are applied to the base of the ejector on the first and second circuit cards.

28. The system of claim 26, wherein the first and second colors are applied to the handle of the ejector on the first and second circuit cards.

29. A central office telecommunications apparatus, comprising:
   a card cage having at least one card guide and at least one channel;
   at least one circuit card engaged with the card guide; and
   at least one ejector, comprising:
      a base coupled to a faceplate of the circuit card; and
      a handle pivotally coupled to the base, the handle having protrusions proximate a first end adapted to engage the channel, the handle also having a fastener disposed through an aperture in the handle such that pivoting of the handle is substantially prevented when the fastener is coupled to the base.

30. The apparatus of claim 29 wherein the fastener is captively disposed within the aperture in the handle.

31. The apparatus of claim 29 wherein the fastener is a screw.

32. The apparatus of claim 29 wherein a pivot axis of the handle is located outside the faceplate of the circuit card.

33. The apparatus of claim 29 wherein the protrusions are operable to secure the circuit card to a backplane in the central office telecommunications apparatus.

34. The apparatus of claim 29 wherein the protrusions are operable to extract the circuit card from a backplane in the central office telecommunications apparatus.

* * * * *